US011538716B2

(12) United States Patent
Matsui et al.

(10) Patent No.: US 11,538,716 B2
(45) Date of Patent: Dec. 27, 2022

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Tomoya Matsui, Toyama (JP); Hideto Tateno, Toyama (JP); Makoto Hirano, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/821,272

(22) Filed: Mar. 17, 2020

(65) Prior Publication Data

US 2020/0303234 A1 Sep. 24, 2020

(30) Foreign Application Priority Data

Mar. 22, 2019 (JP) .............................. JP2019-055549
Feb. 26, 2020 (JP) .............................. JP2020-030713

(51) Int. Cl.
*H01L 21/68* (2006.01)
*H01L 21/687* (2006.01)
*H01L 21/67* (2006.01)

(52) U.S. Cl.
CPC .. *H01L 21/68764* (2013.01); *H01L 21/67098* (2013.01)

(58) Field of Classification Search
CPC ......... H01L 21/67098; H01L 21/67103; H01L 21/67109; H01L 21/6719; H01L 21/67754; H01L 21/67757; H01L 21/68764
See application file for complete search history.

(56) References Cited

U.S. PATENT DOCUMENTS

| | | | |
|---|---|---|---|
| 5,217,501 A | 6/1993 | Fuse et al. | |
| 5,388,944 A | 2/1995 | Takanabe et al. | |
| 6,464,825 B1* | 10/2002 | Shinozaki | H01L 21/67063 156/345.55 |
| 9,966,261 B1* | 5/2018 | Yamamoto | H01L 21/0337 |
| 2011/0308453 A1* | 12/2011 | Su | C23C 16/46 118/708 |

(Continued)

FOREIGN PATENT DOCUMENTS

| | | |
|---|---|---|
| JP | 05-218176 A2 | 8/1993 |
| JP | 09-283509 A | 10/1997 |

(Continued)

OTHER PUBLICATIONS

Japanese Office Action dated Aug. 3, 2021 for Japanese Patent Application No. 2020-030713.

(Continued)

*Primary Examiner* — Mohammed Shamsuzzaman
(74) *Attorney, Agent, or Firm* — Volpe Koenig

(57) ABSTRACT

There is provided a technique that includes a process chamber configured to process a substrate; a transfer chamber in communication with a lower portion of the process chamber, and configured to transfer the substrate to a substrate support disposed in the process chamber, and a heating chamber in communication with a lower portion of the transfer chamber, and configured to heat the substrate support and the substrate.

9 Claims, 9 Drawing Sheets

(56) References Cited

U.S. PATENT DOCUMENTS

| | | | |
|---|---|---|---|
| 2014/0256160 A1* | 9/2014 | Wada | H01L 21/0262 |
| | | | 438/786 |
| 2015/0140835 A1 | 5/2015 | Tateno et al. | |
| 2017/0283945 A1* | 10/2017 | Yahata | H01J 37/32357 |
| 2018/0204735 A1* | 7/2018 | Yuasa | H01L 21/2686 |
| 2019/0062904 A1* | 2/2019 | Hawrylchak | H01L 21/02046 |

FOREIGN PATENT DOCUMENTS

| | | |
|---|---|---|
| JP | 2003-100736 A | 4/2003 |
| KR | 10-0155158 B1 | 12/1998 |
| KR | 10-2015-0031453 A | 3/2015 |
| KR | 10-2016-0123564 A | 10/2016 |

OTHER PUBLICATIONS

Korean Office Action dated Jul. 16, 2021 for Korean Patent Application No. 10-2020-0032614.

Taiwanese Office Action dated Aug. 6, 2021 for Taiwanese Patent Application No. 109109105.

\* cited by examiner

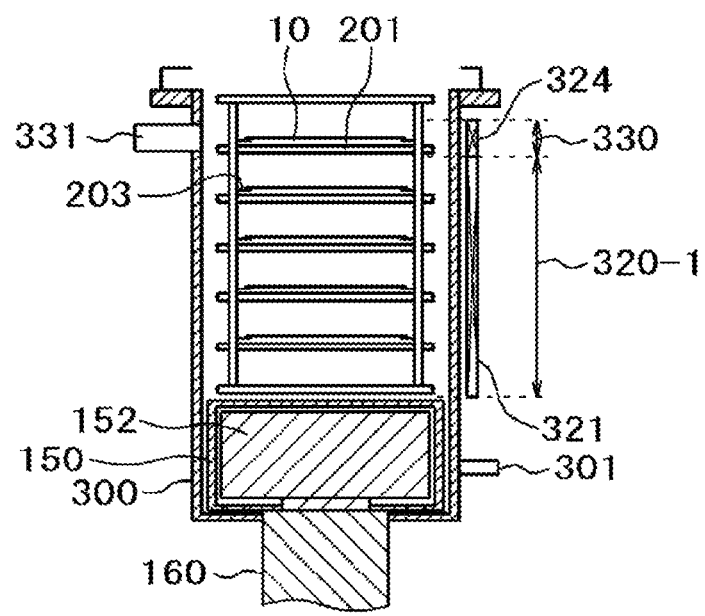

SUBSTRATE PROCESSING APPARATUS, METHOD OF MANUFACTURING SEMICONDUCTOR DEVICE, AND RECORDING MEDIUM

CROSS-REFERENCE TO RELATED APPLICATIONS

This application is based upon and claims the benefit of priority from Japanese Patent Application Nos. 2019-055549 and 2020-030713, filed on Mar. 22, 2019 and Feb. 26, 2020, the entire contents of which are incorporated herein by references.

TECHNICAL FIELD

The present disclosure relates to a substrate processing apparatus for processing a substrate in a semiconductor device manufacturing process, a method of manufacturing a semiconductor device, and a recording medium.

BACKGROUND

For example, a vertical substrate processing apparatus is used for heat treatment of a substrate (wafer) in a semiconductor device manufacturing process. In the vertical substrate processing apparatus, a plurality of substrates are vertically arranged and held by a substrate holder, and the substrate holder is loaded into a process chamber. Thereafter, a process gas is introduced into the process chamber in a state where the process chamber is heated, and a thin film forming process is performed on the substrates.

SUMMARY

Some embodiments of the present disclosure provide a technique capable of improving a throughput of substrate processing.

According to one embodiment of the present disclosure, there is provided a technique that includes a process chamber configured to process a substrate; a transfer chamber in communication with a lower portion of the process chamber, and configured to transfer the substrate to a substrate support disposed in the process chamber, and a heating chamber in communication with a lower portion of the transfer chamber, and configured to heat the substrate support and the substrate.

BRIEF DESCRIPTION OF DRAWINGS

FIG. 11 is a schematic sectional view of a heating chamber in a substrate processing apparatus according to another embodiment of the present disclosure.

DETAILED DESCRIPTION

Figure 1:
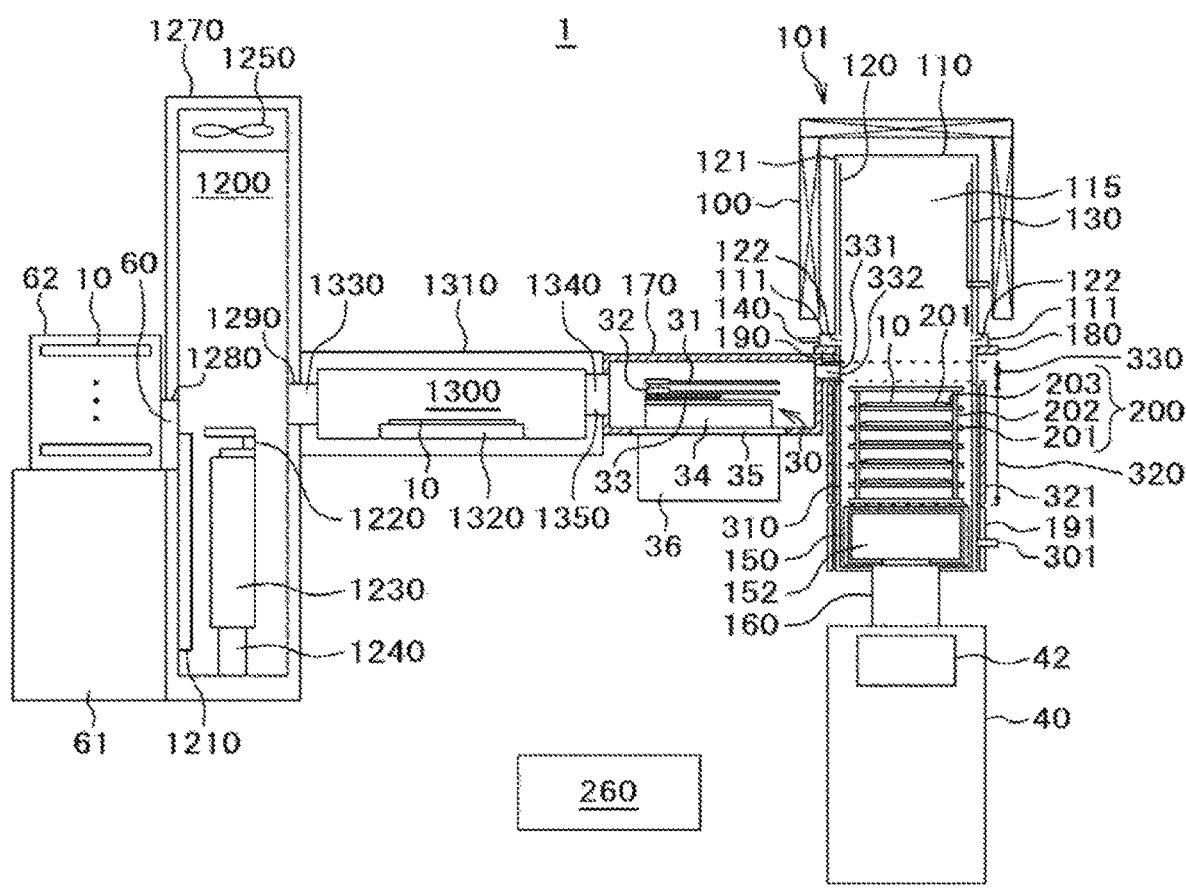
FIG. 1 is a block diagram illustrating the schematic configuration of a substrate processing apparatus according to a first embodiment.

The present disclosure relates to a substrate processing apparatus including: a substrate support configured to mount a substrate, a processing chamber configured to process the substrate mounted on the substrate support, a transfer chamber in communication with a lower portion of the processing chamber and configured to transfer the substrate to the substrate support, a heating chamber in communication with a lower portion of the transfer chamber and configured to heat the substrate support and the substrate, and an elevator part configured to move the substrate support among the process chamber, the transfer chamber, and the heating chamber.

In addition, the present disclosure relates to a method of processing a substrate using a substrate processing apparatus including: a substrate support configured to mount the substrate, a processing chamber configured to process the substrate mounted on the substrate support, a transfer chamber in communication with a lower portion of the processing chamber and configured to transfer the substrate to the substrate support, a heating chamber in communication with a lower portion of the transfer chamber and configured to heat the substrate support and the substrate, and an elevator part configured to move the substrate support between the process chamber, the transfer chamber and the heating chamber, the method including: driving the elevator part to transfer the substrate mounted on the substrate support in the transfer chamber to the heating chamber, heating the substrate in the heating chamber, driving the elevator part to transfer the heated substrate to the process chamber through the transfer chamber communicating with the heating chamber, and processing the heated substrate in the process chamber. Further, the present disclosure relates to a substrate processing program including: a step of transferring a substrate mounted on a substrate support in a transfer chamber to a heating chamber and heating the substrate in the heating chamber, a step of transferring the heated substrate to a process chamber through the transfer chamber communicating with the heating chamber, and a step of processing the heated substrate in the process chamber.

Some embodiments of the present disclosure will now be described with reference to the drawings.

First Embodiment

The configuration of a semiconductor manufacturing apparatus according to a first embodiment will be described with reference to FIG. 1.

The semiconductor manufacturing apparatus according to the present embodiment is configured as a vertical substrate processing apparatus (hereinafter referred to as a substrate processing system) 1 that performs a substrate processing process such as heat treatment as one of manufacturing processes in a method of manufacturing a semiconductor device. As illustrated in FIG. 1, the substrate processing system 1 is provided to process substrates 10 and mainly includes an IO stage 61, an atmosphere transfer chamber 1200, a load lock chamber 1300, a vacuum transfer chamber 170 and a substrate processing apparatus 101.

Figure 2:
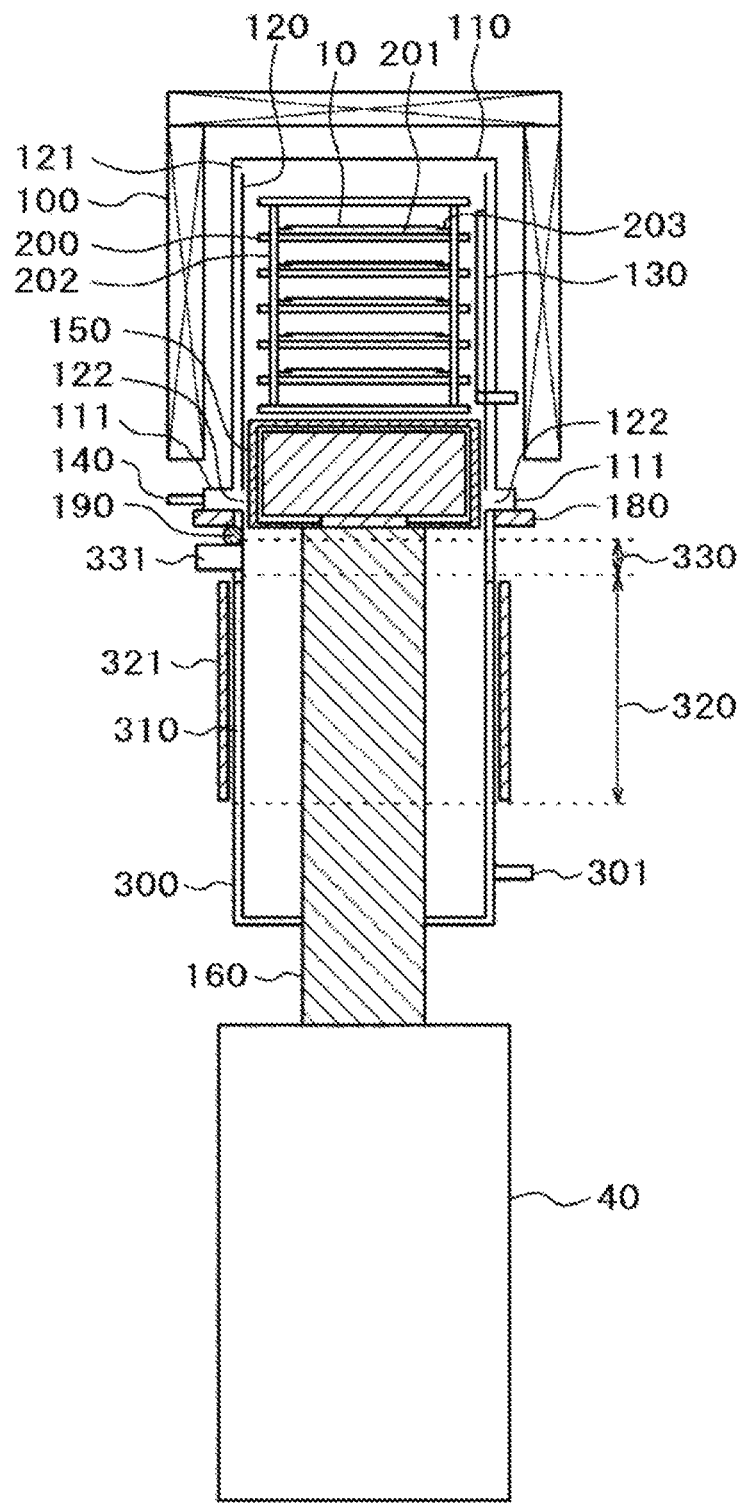
FIG. 2 is a schematic sectional view of a process chamber and a boat storage chamber, which shows a state in which a boat on which substrates are mounted is loaded into the process chamber, in the substrate processing apparatus according to the first embodiment.

FIG. 1 shows a state in which a boat 200 as a substrate support for supporting a plurality of substrates 10 is lowered to a storage chamber 300 provided below a chamber 180 on the side of the vacuum transfer chamber 170, and FIG. 2 is a view of a portion of FIG. 1 and shows a state in which the boat 200 as the substrate support is raised and is inside a first reaction tube 110. The vacuum transfer chamber 170 is also referred to as a transfer module 170. The substrate processing apparatus 101 is also referred to as a process module 101. Next, each configuration will be specifically described.

[Atmosphere Transfer Chamber/IO Stage]

The IO stage (load port) 61 is installed in front of the substrate processing system 1. A plurality of pods 62 as storage containers are configured to be mounted on the 10 stage 61. Each pod 62 is used as a carrier for transferring a substrate 10 such as a silicon (Si) substrate, and the pod 62 is configured to store a plurality of substrates (wafers) 10 in a horizontal posture. The pod 62 stores a maximum of 25 substrates 10.

The pod 62 is provided with a cap 60 which is opened and closed by a pod opener 1210 to be described later. The pod opener 1210 opens and closes the cap 60 of the pod 62 mounted on the IO stage 61 to thereby open and close a substrate loading/unloading port 1280, so that the substrates 10 can be taken in and out of the pod 62. The pod 62 is supplied to and discharged from the 10 stage 61 by an in-process transfer device (RGV: Rail Guided Vehicle) (not shown).

The 10 stage 61 is adjacent to an atmosphere transfer chamber 1200. The load lock chamber 1300 to be described later is connected to a surface of the atmosphere transfer chamber 1200 that is different from the surface of the 10 stage 61.

An atmosphere transfer robot 1220 as a first transfer robot for transferring a substrate 10 is installed in the atmosphere transfer chamber 1200. As illustrated in the figure, the atmosphere transfer robot 1220 is configured to be moved up and down by an elevator 1230 installed in the atmosphere transfer chamber 1200 and is also configured to be reciprocated in a horizontal by a linear actuator 1240.

As illustrated in the figure, a clean unit 1250 for supplying clean air is installed above the atmosphere transfer chamber 1200.

As illustrated in the figure, the substrate loading/unloading port 1280 for loading/unloading the substrate 10 into/from the atmosphere transfer chamber 1200 and the pod opener 1210 are installed in front of a housing 1270 of the atmosphere transfer chamber 1200. The IO stage (load port) 61 is installed on an opposite side of the pod opener 1210 with the substrate loading/unloading port 1280 interposed therebetween, that is, outside the housing 1270.

A substrate loading/unloading port 1290 for loading/unloading the substrate 10 into/from the load lock chamber 1300 is installed on a rear side of the housing 1270 of the atmosphere transfer chamber 1200. The substrate loading/unloading port 1290 is opened and closed by a gate valve 1330 to be described later, so that it is possible to load and unload the substrate 10.

[Load Lock (L/L) Chamber]

The load lock chamber 1300 is adjacent to the atmosphere transfer chamber 1200. As will be described later, the vacuum transfer chamber 170 is disposed on a surface of the housing 1310 constituting the load lock chamber 1300, which is different from the surface of the atmosphere transfer chamber 1200. The load lock chamber 1300 has a structure that can withstand a negative pressure because the internal pressure of the housing 1310 fluctuates according to the pressure of the atmosphere transfer chamber 1200 and the pressure of the vacuum transfer chamber 170.

A substrate loading/unloading port 1340 is formed on the side of the housing 1310 adjacent to the vacuum transfer chamber 170. The substrate loading/unloading port 1340 is opened/closed by a gate valve 1350 to enable the substrate 10 to be loaded and unloaded.

Further, a substrate mounting table 1320 on which the substrate 10 is mounted is installed in the load lock chamber 1300.

[Vacuum Transfer Chamber 170]

The substrate processing system 1 includes the vacuum transfer chamber (transfer module) 170 as a transfer chamber serving as a transfer space in which the substrate 10 is transferred at a negative pressure. The load lock chamber 1300 and the substrate processing apparatus 101 for processing the substrate 10 are connected to each side of the vacuum transfer chamber 170. A transfer device 30 as a vacuum transfer robot for transferring the substrate 10 at a negative pressure is installed at substantially a central portion of the vacuum transfer chamber 170, with a flange 35 as a base.

The transfer device 30 as the vacuum transfer robot installed in the vacuum transfer chamber 170 is configured to be moved up and down while maintaining the airtightness of the vacuum transfer chamber 170 by an elevation mechanism 36 and the flange 35, as illustrated in the figure.

[Substrate Processing Apparatus 101]

The substrate processing apparatus 101 includes a reaction tube composed of a first reaction tube 110 having a cylindrical shape and extending in a vertical direction, and a second reaction tube 120 disposed inside the first reaction tube, and a heater 100 as a first beating means (furnace body) installed on the outer periphery of the first reaction tube 110. The first reaction tube 110 and the second reaction tube 120, which constitute the reaction tube, are made of a material such as quartz or SiC. The interior of the first reaction tube 110 is hermetically sealed against the open air by a means (not shown). The interior of the second reaction tube 120 forms a process chamber 115. Here, the first reaction tube 110 is also referred to as an outer tube. The second reaction tube 120 is also referred to as an inner tube. An example is here shown in which the reaction tube is composed of the first reaction tube 110 and the second reaction tube 120, but the present disclosure is not limited thereto. For example, the technique of the present disclosure can be applied even when the reaction tube is composed of the first reaction tube 110.

In addition, the heater 100 may be configured as a zone heater having a plurality of zones in a vertical direction so that the zones can be controlled in the vertical direction.

[Substrate Support]

The boat 200 as the substrate support is supported by a support rod 160 via a heat insulating part 150. The boat 200 supports a plurality of substrates, for example, five substrates 10 vertically in multiple stages by placing the substrates 10 on a substrate support part 203 attached to a post 202 in a space partitioned by a plurality of discs 201. The boat 200 is made of a material such as quartz or SiC. A substrate holding body is constituted by the heat insulating part 150 and the boat 200. At the time of substrate processing, the boat 200 is stored in the second reaction tube 120, as illustrated in FIG. 2. An example is here shown in which the boat 200 supports five substrates 10, but the present disclosure is not limited thereto. For example, the boat 200 may be configured to support about 5 to 50 substrates 10. The discs 201 are also referred to as a separator.

[Heat Insulating Part 150]

The heat insulating part 150 has a structure in which the conduction or transfer of heat in the vertical direction is reduced. Further, the heat insulating part 150 may be configured to have a cavity therein. As illustrated in the figure, a hole 151 may be formed on the lower surface of the heat insulating part 150. This hole 151 is provided to prevent a pressure difference between the interior and the exterior of the heat insulating part 150, so that the wall surface of the heat insulating part 150 does not need to be thickened.

A cap heater 152 may be installed in the heat insulating part 150.

The boat 200 is disposed inside the storage chamber 300. A boat elevator 40 as an elevation mechanism for the boat 200 is installed at an outside of the storage chamber 300 and, for example, at a lower side of the outside.

The transfer device 30 as the vacuum transfer robot for transferring the substrate 10 between the load lock chamber 1300 and the chamber 180 is installed inside the vacuum transfer chamber 170, with the flange 35 as the base.

The transfer device 30 includes, for example, a tweezer 31 for supporting one substrate 10, an extendable arm 32, a rotary shaft 33, a base 34, a flange 35, an elevation mechanism 36 and so on. The vacuum transfer chamber 170 is configured to maintain airtightness by the flange 35.

The elevation mechanism 36 can operate the transfer device 30 to transfer the substrate 10 between the load lock chamber 1300 and the boat 200.

[Chamber 180]

The chamber 180 is installed below the second reaction tube 120 and includes a transfer chamber 330 and a heating chamber 320, as the storage chamber 300. The transfer chamber 330 is configured as a space in which the substrate 10 is loaded (mounted) on the boat 200 or unloaded from the boat 200. The heating chamber 320 is configured as a space in which the substrate 10 loaded on the boat 200 is heated. The heat insulating part 150 supported by the support rod 160 is stored in a lower portion of the chamber 180.

The vertical length of the transfer chamber 330 is shorter than the vertical length of the heating chamber 320. In other words, the vertical length of the heating chamber 320 is longer than the vertical length of the transfer chamber 330. With such a size relationship, it is possible to shorten the time taken from loading the substrate 10 on the boat 200 to heating the substrate 10, as will be described later.

A cooling channel 190 may be provided in a substrate loading port 331. In this case, heat from the heated boat 200, the heater 100, and a heating part 321 is transferred to the cooling channel 190, which may cause a problem that the temperature rising rate of a new substrate 10 to be described later decreases.

With such a size relationship, it is possible to keep the new substrate 10 away from a low temperature region near the cooling channel 190 and thus to improve the temperature rising rate of the new substrate 10. The vertical length of the heating chamber 320 can be said to be a length including the entire substrate mounting region of the heat insulating part 150 and the boat 200.

Here, the chamber 180 is made of a metal material such as stainless steel (SUS) or aluminum (Al). In this case, the storage chamber 300 of the chamber 180 may expand due to the heating chamber 320. In this case, as illustrated in FIG. 1, a cooling channel 190 may be provided outside the storage chamber 300 of the chamber 180 so that the storage chamber 300 can be cooled.

Further, an inert gas supply pipe 301 for supplying an inert gas is installed inside the storage chamber 300 of the chamber 180. The inert gas is supplied from the inert gas supply pipe 301 into the storage chamber 300 so that the internal pressure of the storage chamber 300 may be adjusted to be higher than the internal pressure of the first reaction tube 110. With such a configuration, it is possible to suppress a process gas supplied into the process chamber 115 inside the first reaction tube 110 from entering the storage chamber 300.

[Heating Chamber 320]

Figure 7:
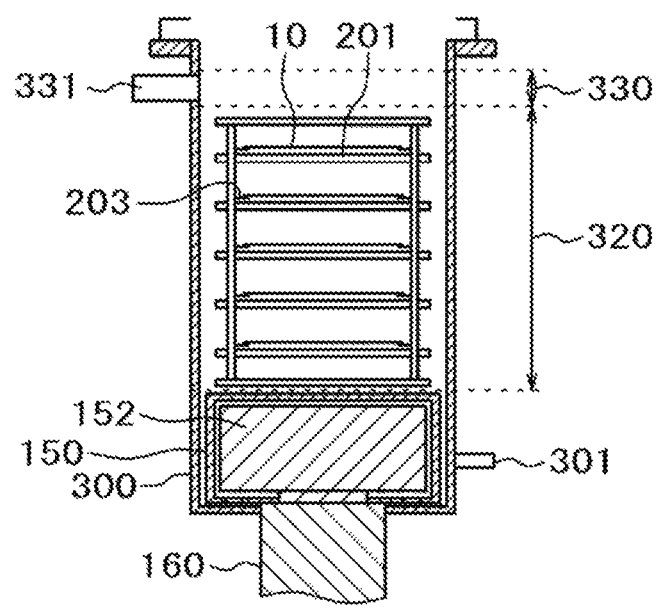
FIG. 7 is a schematic sectional view of a heating chamber in a substrate processing apparatus according to another embodiment of the present disclosure.
Figure 8:
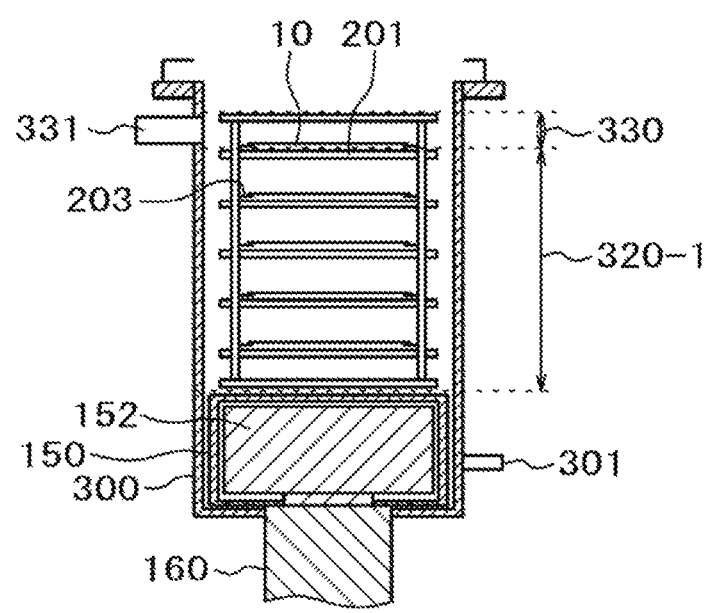
FIG. 8 is a schematic sectional view of a heating chamber in a substrate processing apparatus according to another embodiment of the present disclosure.

The heating chamber 320 is a space in which the substrate 10 is heated by the boat 200 or the heating part 321 to be described below, and is provided below the transfer chamber 330. As illustrated in FIGS. 1 to 6, a window (for example, quartz) 310 through which an infrared ray is transmitted may be formed in the heating chamber 320. The heating part 321 composed of a plurality of lamp heaters with their longitudinal directions aligned vertically may be installed outside the window. Although an example in which a lamp heater is used as the heating part 321 is shown here, the configuration of the heating part 321 is not limited to this example. For example, the heating part 321 may be a resistance heater. Further, as illustrated in FIGS. 7 and 8, the heating part 321 and the window 310 may not be provided. The substrate 10 can be heated by the heated boat 200 without providing the heating part 321 and the window 310.

[Transfer Chamber 330]

In the transfer chamber 330, the transfer device 30 is used to unload the substrate 10 mounted on the boat 200 from the boat 200 via the substrate loading port 331 and load a new substrate 10 on the boat 200. In addition, a gate valve (GV) 332 that isolates between the transfer chamber 330 and the chamber 180 is installed at the substrate loading port 331.

The support rod 160 is supported by the boat elevator 40. The boat elevator 40 is driven to move the support rod 160 up and down, so that the boat 200 is loaded/unloaded into/from the second reaction tube 120. The support rod 160 is connected to a rotation drive part 42 provided in the boat elevator 40. When the support rod 160 is rotated by the rotation drive part 42, the heat insulating part 150 and the boat 200 can be rotated. The rotation drive unit 42 and the support rod 160 are collectively referred to as a rotation mechanism unit.

The substrate processing system 1 supplies a gas used for substrate processing through a nozzle 130 serving as a gas supply part disposed inside the second reaction tube 120, from a gas supply means (not shown). The gas supplied through the nozzle 130 is appropriately changed depending on the type of a film to be formed. A precursor gas, a reaction gas, an inert gas and the like are supplied through the nozzle 130 into the second reaction tube 120.

On the other hand, among the gases supplied through the nozzle 130 into the second reaction tube 120, a reaction gas that has not contributed to the film formation is exhausted by an exhaust pump (not shown) to the outside from an exhaust pipe 140 as an exhaust part through an upper gap 121 and a lower opening 122 of the second reaction tube 120 and the first reaction tube 110.

A pumping part 111 is formed at the lower end of the first reaction tube 110. Since the pumping part 11 is provided below the heater 100, a uniform heat region by the heater 100 can be secured above the pumping part 111 inside the first reaction tube 110.

The opening 122 of the second reaction tube 120 is formed at a plurality of locations around the position where the pumping part 111 is disposed. By forming the opening 122 around the position where the pumping part 111 is disposed, that is, on the side closer to the chamber 180, it is possible to prevent the inert gas supplied from the inert gas supply pipe 301 from flowing more than necessary into the process chamber.

The boat 200 as a substrate holder has a plurality of upright posts 202, discs 201 supported by the plurality of posts 202 at a fixed interval, and the substrate support part 203 supported by the posts 202 between the quartz discs 201.

The boat 200 supports, for example, five substrates 10 vertically aligned in a horizontal posture, with their centers aligned with each other, in multiple stages. There, the substrates 10 are arranged at regular intervals. The boat 200 is formed of a heat resistant material such as quartz or SiC.

The second reaction tube 120 preferably has a minimum inner diameter that allows the boat 200 to be safely loaded and unloaded.

Figure 9:
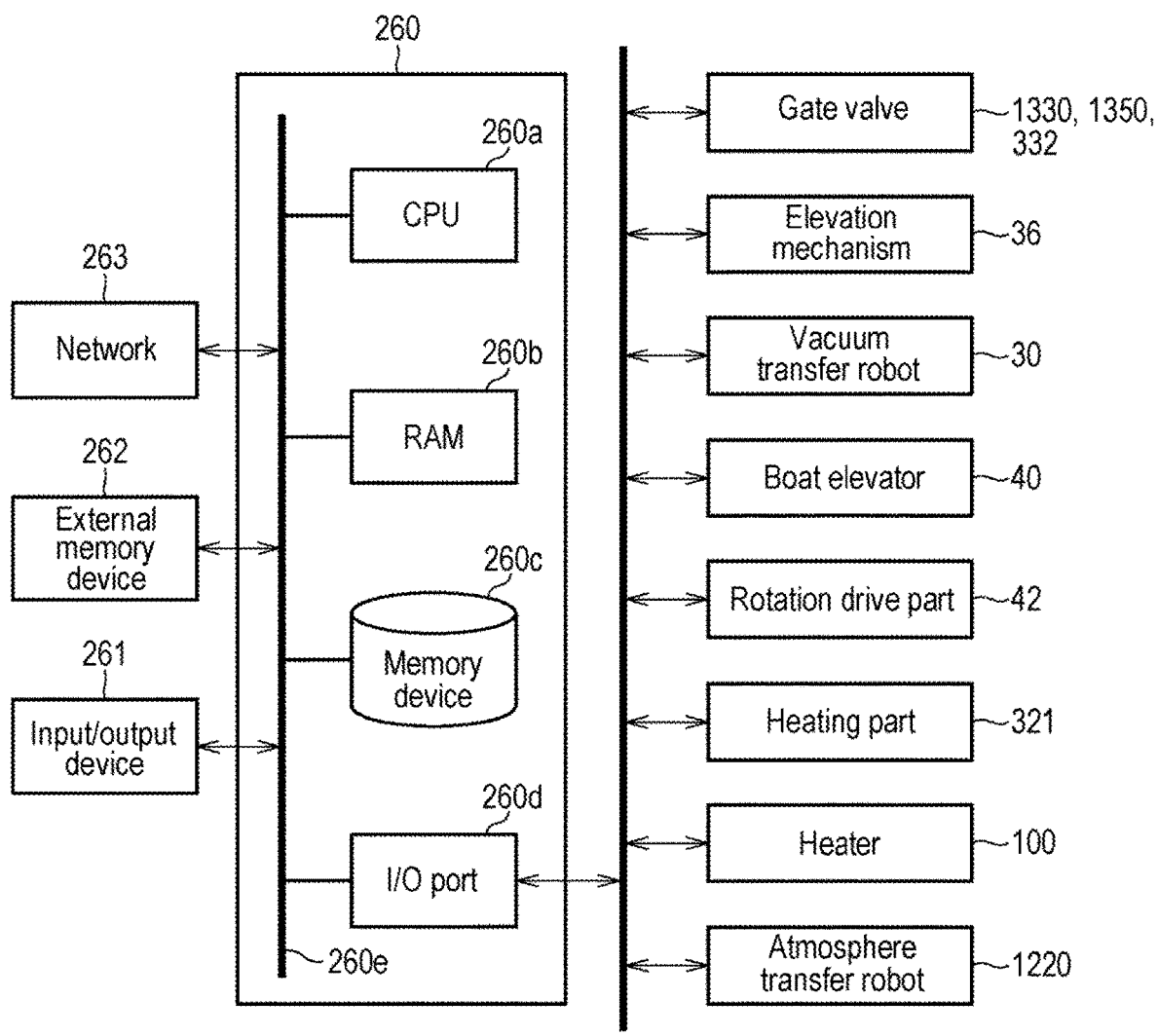
FIG. 9 is a block diagram illustrating the schematic configuration of a controller that operates each part of the substrate processing apparatus according to the embodiment of the present disclosure.

As illustrated in FIGS. 1 and 9, the substrate processing apparatus 101 or the substrate processing system 1 has a controller 260 that controls the operations of various parts.

FIG. 9 illustrates the schematic configuration of the controller 260. The controller 260, which is a control part (control means), is configured as a computer including a CPU (Central Processing Unit) 260a, a RAM (Random Access Memory) 260b, a memory device 260c and an I/O port 260d. The RAM 260b, the memory device 260c and the I/O port 260d are configured to be able to exchange data with the CPU 260a via an internal bus 260e. The controller 260 is configured to be connected to an input/output device 261 such as a touch panel or the like, or an external memory device 262.

The memory device 260c is configured by, for example, a flash memory, an HDD (Hard Disk Drive) or the like. In the memory device 260c, a control program for controlling the operation of the substrate processing apparatus, a process recipe in which a substrate processing procedure and conditions described later are described, and the like are stored in a readable manner. Note that the process recipe is a combination of the controller 260 that executes each procedure in a substrate processing process described below to obtain a predetermined result, and functions as a program. Hereinafter, the program recipe, the control program, and the like are collectively referred to simply as a program. In this specification, the term "program" may include only a program recipe alone, may include only a control program, or may include both. The RAM 260b is configured as a memory area (work area) in which programs, data, and the like read by the CPU 260a are temporarily stored.

The I/O port 260d is connected to the gate valves 1330, 1350 and 1490, the elevation mechanism 36, the boat elevator 40, the heater 100, the heating part 321, a pressure regulator (not shown), a vacuum pump (not shown) and the like. Further, the I/O port 260d may be connected to the transfer device 30 as a vacuum transfer robot, the atmosphere transfer robot 1220, the load lock chamber 1300, a gas supply part (mass flow controller (MFC)) (not shown), a valve (not shown)) and the like. The term "connection" used in the present disclosure includes not only connection of various parts by a physical cable but also direct or indirect transmission/reception of signals (electronic data) of various parts. For example, a device for relaying a signal or a device for converting or calculating a signal may be provided between the parts.

The CPU 260a is configured to read and execute the control program from the memory device 121c. The CPU 260a also reads the recipe from the memory device 260c according to an input of an operation command from the controller 260. In addition, the CPU 260a is configured to control the opening/closing operation of the gate valves 1330, 1350 and 332, the elevation mechanism 36, the raising/lowering operation of the boat elevator 40, the rotating operation of the rotation drive part 42, the operation of supplying power to the heater 100 and the heating part 321, the transfer device 30 as a vacuum transfer robot, the atmosphere transfer robot 1220, and the like, according to the contents of the read process recipe. Further, the gas supply part (mass flow controller (MFC)) (not shown) and the valve (not shown)) is also controlled, but not shown.

The controller 260 is not limited to being configured as a dedicated computer, but may be configured as a general-purpose computer. For example, the controller 260 according to the present embodiment may be configured by preparing an external memory device (for example, a magnetic tape, a magnetic disk such as a flexible disk or a hard disk, an optical disc such as a CD or a DVD, a magneto-optical disc such as an MO, or a semiconductor memory such as a USB memory or a memory card) 262 storing the aforementioned program and installing the program on the general-purpose computer using the external memory device 262. A means for supplying the program to the computer is not limited to a case where the program is supplied via the external storage device 262. For example, the program may be supplied by using a communication means such as a network 263 (the Internet or a dedicated line) without using the external storage device 262. The memory device 260c and the external memory device 262 are configured as a computer-readable recording medium. Hereinafter, these devices are collectively referred to simply as a recording medium. When the term "recording medium" is used in the present disclosure, it may indicate a case of including the memory device 260c only, a case of including the external memory device 262 only, or a case of including both the memory device 260c and the external memory device 262.

(2) First Substrate Processing Process

Next, as one of processes of manufacturing a semiconductor device using the above-described substrate processing apparatus, an example in which an insulating film, for example, a silicon oxide (SiO) film as a silicon-containing film, is formed on a substrate will be described with reference to FIGS. 2, 3, 10 and so on. In the following description, the operations of various parts constituting the substrate processing apparatus 101 are controlled by the controller 260.

When the term "substrate" is used in the present disclosure, it may be synonymous with the term "wafer." In that case, in the above description, the "substrate" may be replaced with the "wafer."

The following is an example of a flow of a series of substrate processing steps including a film forming step S203 of forming a film on a substrate 10, as one of processes of manufacturing a semiconductor device.

[Preliminary Atmosphere Adjusting Step: S200]

First, the interior of the process chamber 115 and the boat 200 are heated by the heater 100 to a predetermined temperature of a film forming step S203. At this time, the boat 200 is heated in a state where it is arranged at a processing position shown in FIG. 2. After the interior of the process chamber 115 and the boat 200 reach the predetermined temperature, the interior of the process chamber 115 is vacuum-exhausted from the exhaust pipe 140 by a vacuum pump (not shown) so as to have a desired pressure (degree of vacuum). The heating of the process chamber 115 by the heater 100 and the exhaust of the process chamber 115 are continuously performed at least until the processing on the substrate 10 is completed.

In addition, the heating part 321 may be turned on to preheat the interior of the heating chamber 320 to a predetermined temperature.

[Substrate Loading Step: S201]

Subsequently, a substrate loading step S201 is performed. In the substrate loading step, at least a substrate mounting step S201a and a first substrate heating step S201b are performed.

[Substrate Mounting Step S201a/First Substrate Heating Step: S201b]

Here, the substrate mounting step S201a and the first substrate heating step S201b are performed in parallel.

[Substrate Mounting Step: S201a]

First, the substrate mounting step S201a will be described. A step of mounting the substrate 10 on the boat 200 and arranging the boat 200 with the substrate 10 mounted thereon in the process chamber is performed. Specifically, from the state of FIG. 2, it is assumed that the substrate support part 203 provided at the lowermost side of the boat 200 has been inserted into the transfer chamber 330. One pitch (the substrate support part 203 on which one substrate is placed) is also referred to as being inserted into the transfer chamber 330. At this time, the most portion of the boat 200 faces the heater 100 and is in a heated state. In this state, the substrate 10 is mounted on the substrate support part 203 of the boat 200 from the transfer device 30 through the substrate loading port 331 of the transfer chamber 330. This step is repeated while lowering the substrate support part 203 of the boat 200 by one pitch (boat down), so that the substrates 10 are mounted on the substrate support parts 203 of all stages of the boat 200. This operation is performed while moving the support rod 160 with the boat elevator 40.

[First Substrate Heating Step: S201b]

Next, the first substrate heating step S201b will be described with reference to FIG. 3. The first substrate heating step S201b is performed in order from the substrates 10 mounted on the boat 200 in the above-described substrate mounting step S201a. As illustrated in FIG. 3, a substrate 10 mounted at the first pitch from the bottom is heated at least by the heated boat 200. A step of heating the substrate 10 in this manner is referred to as the first substrate heating step S201b. At this time, in order to increase a temperature rising speed (temperature rising rate) of the substrate 10 mounted on the boat 200, the heating part 321 is turned on in advance to heat the substrate 10. The first substrate heating step S201b is continued until the substrates 10 are mounted on the substrate support parts 203 of all stages of the boat 200. In this step, the substrates 10 are heated to a temperature range of, e.g., about 200 to 450 degrees C.

Next, with the substrates 10 mounted on the substrate support parts 203 of all stages of the boat 200, the support rod 160 is raised by the boat elevator 40 to load the boat 200 into the second reaction tube 120 (boat loading) (the state shown in FIG. 2).

At the time of boat loading, the temperature of the lower side of the process chamber 115 may overshoot. In this case, the heater 100 may be configured as a zone heater having zones divided in the vertical direction, and the output of the lower zone heater may be smaller than the output of the other zone heaters.

In a substrate replacing step S206a, the boat 200 is in a state where its rotation is stopped. Since the rotation of the boat 200 is stopped, a temperature difference (temperature distribution) may be formed in the rotation direction (circumferential direction) of the substrate 10 or the boat 200 in the method of rotating the boat 200 (circumferential direction of the substrate 10). For example, the temperature of a portion facing the substrate loading port 331 may be lower than the temperature of other portions. In order to eliminate this temperature difference, the boat 200 may be rotated after a new substrate 10 is mounted on the uppermost substrate support part 203 of the boat 200.

[Second Substrate Heating Step: S202]

Figure 10:
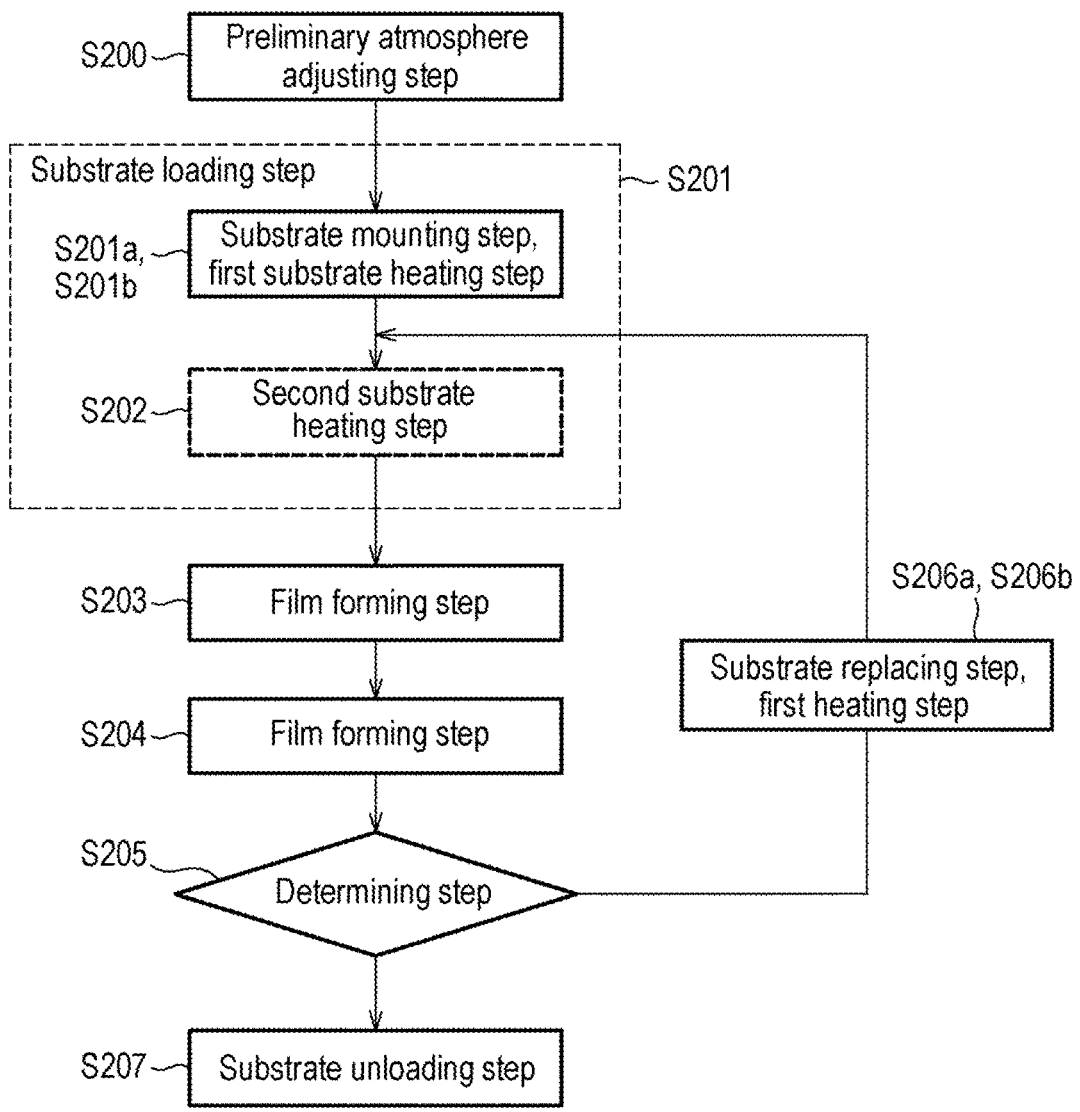
FIG. 10 is a flowchart illustrating a semiconductor device manufacturing process according to an embodiment of the present disclosure.

In addition, before the boat 200 is raised, a second substrate heating step S202 may be performed as indicated by a broken line in FIG. 10. This step is performed, for example, when the rising of the temperature of the substrate 10 is slow. The second substrate heating step S202 is a step of heating the substrate 10 to a predetermined temperature while waiting for a predetermined time in the state shown in FIG. 4. For example, the substrate 10 is heated to a temperature range of about 200 to 450 degrees C.

[Film Forming Step: S203]

Subsequently, a precursor gas is supplied from a gas supply system (not shown) into the second reaction tube 120 via the nozzle 130 and is exhausted by an exhaust pump (not shown) from the exhaust pipe 140 to the outside through the upper gap 121 and the lower opening 122 of the second reaction tube 120 and the first reaction tube 110.

By repeating several steps including the step of supplying the precursor gas into the second reaction tube 120 via the nozzle 130 and exhausting the precursor gas to the outside by the exhaust pump, a thin film having a desired thickness is formed on the surface of the substrate 10 mounted on the boat 200. For example, an aminosilane-based gas or an oxygen-containing gas is supplied. An example of the aminosilane-based gas may include a bisdiethylaminosilane ($H_2Si(NEt_2)_2$, abbreviation: BDEAS) gas. Examples of the oxygen-containing gas may include an oxygen gas ($O_2$), an ozone gas ($O_3$), water ($H_2O$), a nitrous oxide gas ($N_2O$) and the like.

[Atmosphere Adjusting Step: S204]

After the thin film having a desired thickness is formed on the surface of the substrate 10, an atmosphere adjusting step S204 is performed. A $N_2$ gas is supplied from the gas supply system (not shown) into the second reaction tube 120 via the nozzle 130 and is exhausted by the exhaust pump (not shown) from the exhaust pipe 140 to the outside, so that the interior of the process chamber 115 is purged with the inert gas to remove gases and by-products remaining in the process chamber 115 from the process chamber 115.

[Determining Step: S205]

Subsequently, a step S205 of determining whether to repeat the above-described film forming step S203 on a new unprocessed substrate 10 is performed. When there is an unprocessed substrate 10 ("YES" in the determining step S205), a substrate replacing step S206a and a first heating step S206b are performed. When there is no unprocessed substrate 10 ("NO" in the determining step S205), a substrate unloading step S207 is performed.

[Substrate Replacing Step: S206a]

Figure 3:
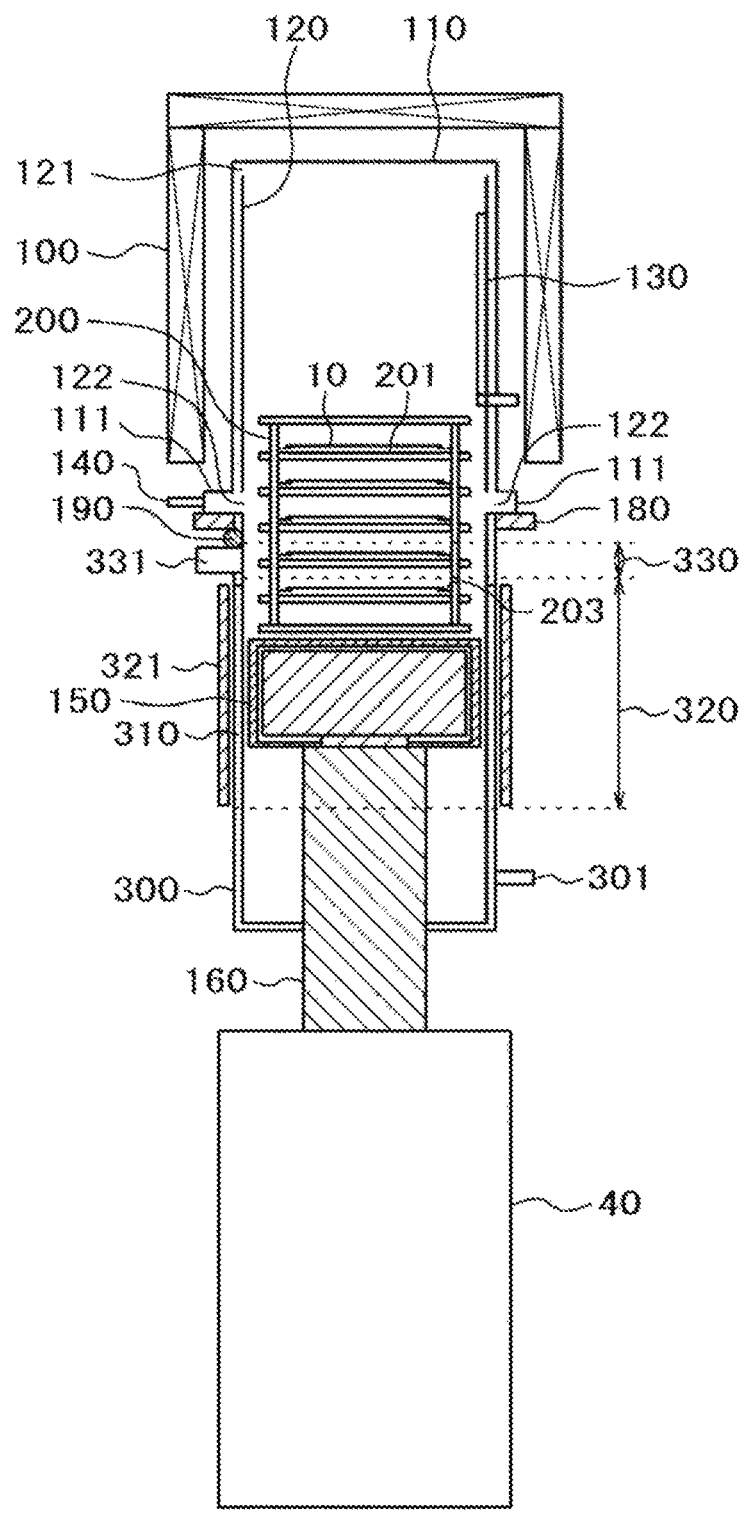
FIG. 3 is a schematic sectional view of the process chamber and the boat storage chamber, which shows a state in which the boat on which substrates are mounted is unloaded from the process chamber, in the substrate processing apparatus according to the first embodiment.

After that, the boat elevator 40 is driven to lower the support rod 160, and as illustrated in FIG. 3, the boat 200 on which the substrate 10 which the thin film having the predetermined thickness formed thereon is mounted is transferred to the storage chamber 300.

When the boat 200 on which the substrate (processed substrate) 10 with the thin film formed thereon is mounted is transferred to the storage chamber 300, in the present embodiment, a step of unloading the substrate 10 with the thin film formed thereon from the boat 200 through the substrate loading port 331 of the transfer chamber 330 and mounting a new substrate (unprocessed substrate) 10 on the boat 200 is performed one by one by driving the boat elevator 40 to transfer the boat 200 at a pitch.

Although the order in which the substrates 10 are replaced may be various, such as from the top, from the bottom, or near the middle of the boat 200, the replacement of the substrates 10 in order from the bottom of the boat 200 can further shorten the time required to raise the temperatures of the substrates 10. However, since the temperatures of the uppermost and lowermost substrates 10 mounted on the boat 200 tend to be higher than those of the substrates 10 mounted in the vicinity of the middle of the boat 200, the replacement may be started in order from the vicinity of the middle of the boat 200.

This operation is performed until the entire substrates 10 with the thin films formed thereon, which are mounted on the boat 200, are replaced with new substrates 10. At this time, in order to improve the temperature rising rates of the new substrate s10, the heating part 321 of the storage chamber 300 is generating heat, and the interior of the heating chamber 320 may be heated via the window 310 by an infrared ray. As a result, even when the lower end of the boat 200 enters the transfer chamber 330 and the substrate replacement is started, the lower portion of the boat 200 is heated by the heating part 321 attached to the outer peripheral portion of the heating chamber 320 to prevent a decrease in the temperature of the boat 200.

Figure 4:
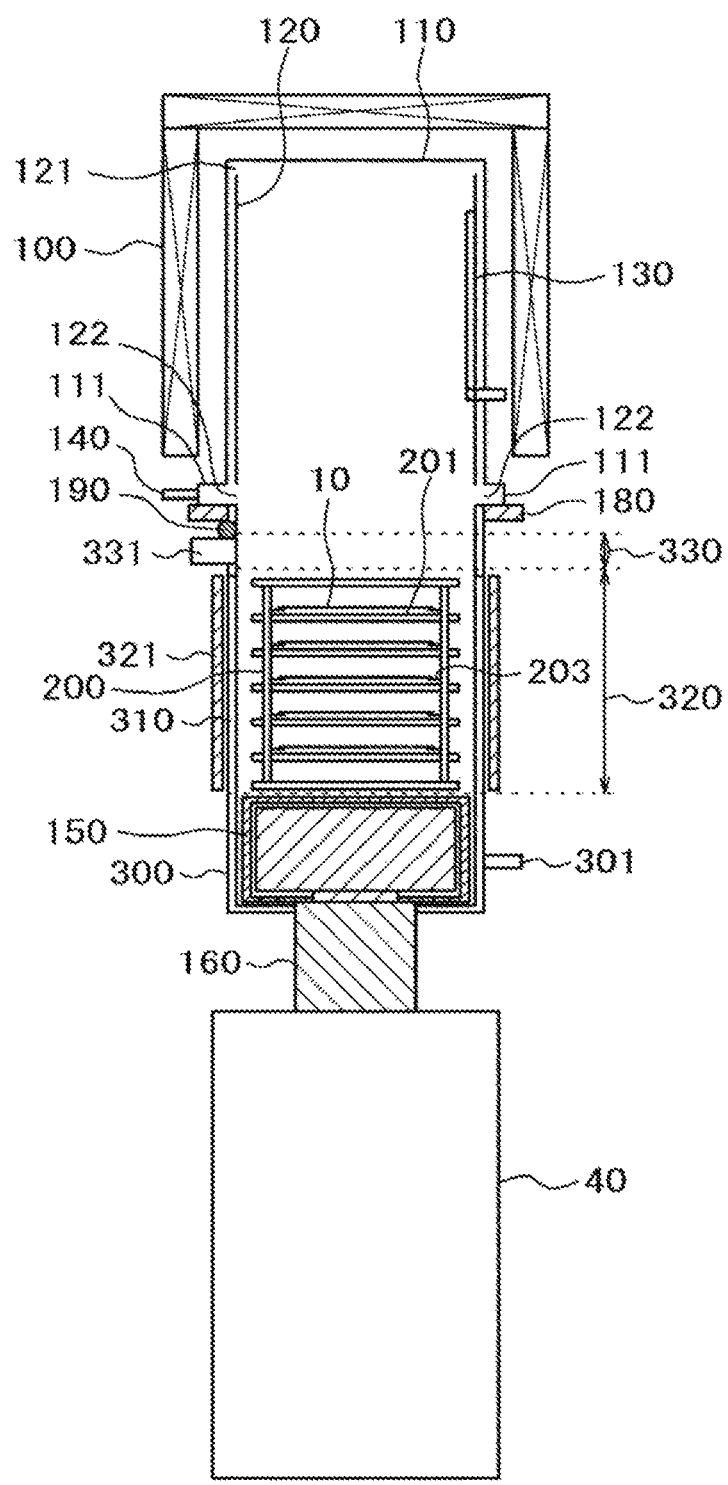
FIG. 4 is a schematic sectional view of the process chamber and the boat storage chamber, which shows a state in which the boat on which substrates are mounted is loaded into the boat storage chamber, in the substrate processing apparatus according to the first embodiment.

In this way, by heating the interior of the heating chamber 320 by the heating part 321, as illustrated in FIG. 4, at the point of time when all the substrates 10 formed thereon with the thin films, which are mounted on the boat 200, are replaced with the new substrates 10, the boat 200 and the substrates 10 newly mounted on the boat 200 are heated inside the heating chamber 320 to raise the temperatures thereof.

When all the substrates 10 formed thereon with the thin films, which are mounted on the boat 200, are replaced with the new substrates 10, the boat elevator 40 is driven to raise the boat 200, and the boat 200 is loaded from the storage chamber 300 into the second reaction tube 120 (the state shown in FIG. 2).

In this state, since the interiors of the storage chamber 300 and the process chamber 115 are vacuum-exhausted from the exhaust pipe 140 by the vacuum pump (not shown), the boat is loaded into the process chamber 115 from the storage chamber 300 in a vacuum state. As a result, the need for vacuum-exhausting the process chamber after loading the boat 200 into the process chamber 115 from the storage chamber 300 is eliminated, thereby reducing the entire processing time. In this manner, by loading the boat 200 into the process chamber 115 from the storage chamber 300 in a vacuum state, a decrease in the temperature of the process chamber 115 can be suppressed. In addition, a decrease in the temperature of the substrate 10 during the movement of the heated substrate 10 from the heating chamber 320 to the process chamber 115 can be suppressed.

After the boat 200 is loaded, the substrate 10 is heated by the heater 100 so that the substrate 10 has a desired temperature. At this time, since the boat 200 and the substrate 10 have already been heated in the transfer chamber 330, the time required to increase the temperature required to start the film forming process can be significantly shortened as compared with a case where the substrate is loaded into the process chamber 115 in a room temperature state without being heated in the transfer chamber 330. As a result, the time for substrate processing can be shortened, thereby improving a throughput.

Here, by performing the replacement of the new substrate 10 in the boat 200, for example, in order from the bottom of the boat 200, the time during which the newly replaced substrate 10 stays inside the heating chamber 320 differs. Therefore, a temperature difference occurs between a substrate 10 mounted on the lowermost stage of the boat 200 and a substrate 10 mounted on the lowermost stage of the boat 200.

In the above embodiment, the boat elevator 40 is driven to transfer the boat 200 at a pitch, the substrate 10 on which the thin film is formed is unloaded from the boat 200, and one new substrate 10 is mounted on the boat 200. However, a plurality of substrates 10 may be simultaneously unloaded from the boat 200 and a plurality of new substrates 10 may be simultaneously mounted on the boat 200. In this case, the boat elevator 40 transfers the boat 200 by the pitch of the plurality of substrates 10.

In addition, after a plurality of substrates 10 are simultaneously taken out of the boat 200 and a plurality of new substrates 10 are simultaneously mounted on the boat 200, all of the unprocessed substrates 10 newly mounted on the boat 200 may be collectively heated.

In addition, when the boat 200 is lowered by the boat elevator 40 and the thin film-formed substrate 10 mounted on the boat 200 is replaced with the new substrate 10, the heating by the heater 100 of the substrate processing apparatus 101 may be continued. As a result, a decrease in the temperature of the upper portion of the boat 200 can be suppressed. Accordingly, a temperature difference between the upper substrate 10 of the boat 200 and the lower substrate 10 of the boat 200 due to the short heating time of the upper substrate 10 of the boat 200 in the heating chamber 320 after the movement and replacement of the new substrate 10 can be alleviated to some extents.

Further, in the substrate replacing step S206a, the cap heater 152 may be continuously turned on to perform the boat down and the boat loading. By continuing to turn on the cap heater 152, it is possible to suppress a decrease in the temperature of the heat insulating part 150 and the substrate support part 203 below the boat 200.

[Substrate Unloading Step: S207]

A substrate unloading step S207 is performed when there is no new substrate 10. The operation of the substrate unloading step S207 is configured such that a new substrate 10 is not placed in the substrate replacing step S206a. Thus, the substrate processing process of this embodiment is performed.

According to the present embodiment, by heating the substrate 10 in the heating chamber 320, the heating time of the substrate 10 mounted on the boat 200 loaded into the process chamber 115 from the transfer chamber 330 can be further shortened as compared with a case where the substrate 10 is not heated in the heating chamber 320, thereby improve the processing throughput.

[First Modification]

Figure 5:
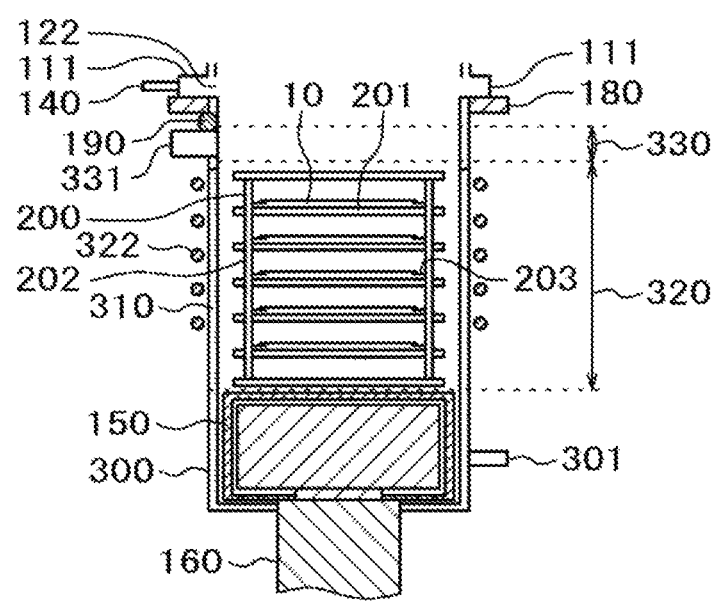
FIG. 5 is a schematic sectional view of a boat storage chamber, which shows a state in which a ring-shaped heater is disposed around a heating chamber in a substrate processing apparatus according to a first modification.

In the first embodiment, an example has been described in which a plurality of lamp heaters as the heating part 321 are aligned and arranged in the longitudinal direction of the heating chamber 320. However, in a first modification, as illustrated in FIG. 5, a plurality of ring-shaped lamp heaters 322 are arranged in the longitudinal direction of the heating chamber 320 along the outer periphery of the heating chamber 320. The same components as those in the first embodiment are denoted by the same reference numerals, and explanation thereof will not be repeated.

In this case, the ring-shaped lamp heaters 322 are disposed for each of the substrates 10 mounted on the boat 200 in accordance with a pitch in the height direction of the substrates 10 mounted on the boat 200 inside the heating chamber 320. In this case, the ring-shaped lamp heaters 322 are arranged to be higher than the corresponding substrates 10 (the mounting surface of the boat 200).

In addition, in place of the ring-shaped lamp heaters 322, a plurality of rod-shaped lamp heaters may be arranged along the outer periphery of the heating chamber 320.

Further, the output of the ring-shaped lamp heaters 322 arranged in the longitudinal direction of the heating chamber 320 along the outer periphery of the heating chamber 320 may be changed along the longitudinal direction of the heating chamber 320.

This modification can achieve the same effects as the first embodiment.

[Second Modification]

Figure 6:
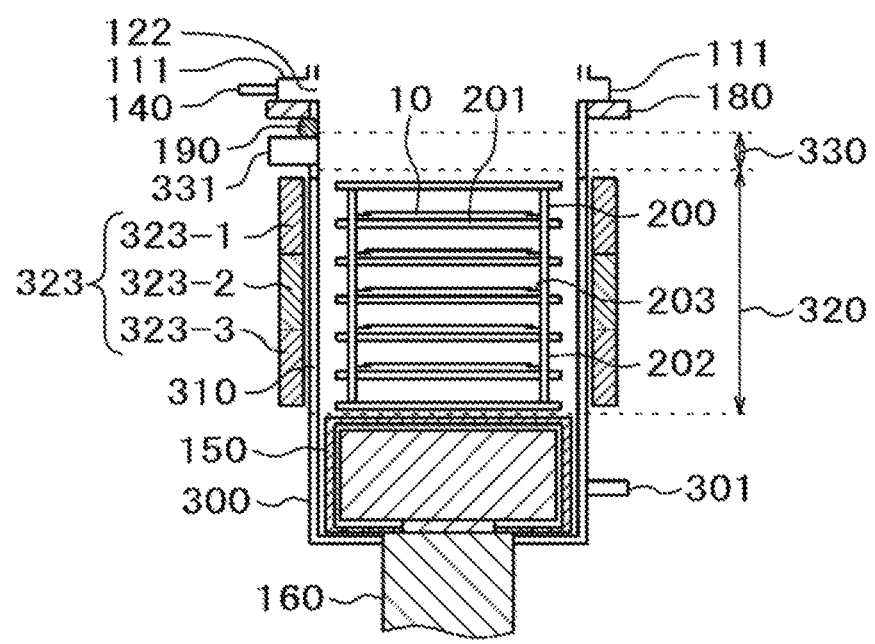
FIG. 6 is a schematic sectional view of a boat storage chamber, which shows a state in which a heater around a heating chamber is divided into three blocks, in a substrate processing apparatus according to a second modification.

As a second modification, as illustrated in FIG. 6, the heating chamber 320 is divided into a plurality of blocks, and the heating temperature differs for each block. FIG. 6 illustrates an example in which the heating chamber 320 is divided into three blocks 323-1, 323-2 and 323-3.

In this way, by dividing the heating chamber 320 into a plurality of blocks and setting the temperature of the upper block 323-1 to be higher than the temperature of the lower block 323-3, it is possible to reduce a temperature difference between the substrate 10 mounted on the uppermost stage of the boat 200 and the substrate 10 mounted on the lowermost stage of the boat 200, which is caused by a difference in staying time in the heating chamber 320.

According to the second modification, the temperature difference between the upper and lower substrates 10 mounted on the boat 200 can be reduced. Therefore, the heating time of the substrates 10 mounted on the boat 200 loaded into the process chamber 115 from the transfer chamber 330 can be further reduced as compared with the first embodiment, thereby improving the processing throughput.

[Third Modification]

A third modification is a configuration illustrated in FIG. 8. FIG. 8 illustrates a configuration in which the height of the chamber 180 is shorter than those in the other figures. Specifically, when the boat 200 is moved to the lower end of the storage chamber 300, the uppermost substrate support part 203 of the boat 200 faces the substrate loading port 331.

With this configuration, the vertical stroke length of the boat 200 can be shortened, thereby reducing the transfer time of the boat 200 (the substrates 10).

In addition, a distance from the lower end of the chamber 180 to the heater 100 is configured to be short, so that the radiant heat from the heater 100 can easily reach the boat 200 to heat the disc 201 at the upper end of the boat 200. In addition, the lower opening (between the reaction tube and the chamber 180) of the process chamber 115 is simply closed by the disc 201 at the upper end of the boat 200, so that a decrease in the internal temperature of the process chamber 115 can be suppressed. In this configuration, it can be said that the vertical length of the heating chamber 320 includes a portion of the heat insulating part 150 and a portion of the substrate mounting region of the boat 200.

While the present disclosure has been specifically described based on the embodiments, it is needless to say that the present disclosure is not limited to the embodiments but can be modified in different ways without departing from the spirit and scope of the present disclosure. For example, the above-described embodiments have been described in detail for easy understanding of the present disclosure and are not necessarily limited to those having all the configurations described above. Further, for some components of each embodiment, it is possible to add, delete or replace other components.

For example, although an example in which the heating parts 321 are provided on both sides of the storage chamber 300 is illustrated in FIG. 2, the present disclosure is not limited to this configuration, but one heating part 321 may be provided on only one side thereof. Alternatively, the heating part 321 may be configured to surround the wall of the storage chamber 300.

As a result of intensive studies, it has found that the temperature rising rate of the substrate 10 can be enhanced by configuring a substrate processing apparatus 101 as illustrated in FIG. 11. The substrate processing apparatus 101 illustrated in FIG. 11 is different from the substrate processing apparatus 101 illustrated in FIG. 2 in that the former further includes a second heating part 324 in FIG. 11. The second heating part 324 is provided above the heating part 321 (also referred to as the first heating part 321). Specifically, the second heating part 324 is provided in the transfer chamber 330 so as to face the substrate loading port 331. More specifically, the second heating part 324 is provided at a position at which the uppermost substrate 10 mounted on the uppermost substrate support part 203 among the substrate support parts 203 provided on the boat 200 can be heated.

Heating treatment using the second heating part 324 will be described. The substrate to be processed is mounted on the boat 200 while being heated by the first heating part 321, and after the substrates 10 to be processed is entirely mounted on the boat 200, the second heating part 324 is turned on. By operating (turning on) the second heating part 324, the temperature rising rate of the substrate 10 that has been lastly mounted on the boat 200 is enhanced. The second heating part 324 may be configured to be capable of heating the boat 200 by continuing the ON state at least until the lower end of the boat 200 passes by.

With this configuration, it is possible to start heating the unprocessed substrate 10 that is mounted on the uppermost substrate support part 203 immediately after being mounted on the substrate support part 203. Since the entire heating time of the substrate 10 mounted on the boat 200 is determined by the temperature rise of the uppermost substrate 10 that has been lastly mounted on the substrate support part 203, it is possible to shorten the entire heating time of the substrate 10 by heating the uppermost substrate 10 by the second heating unit 324, and starting the heating immediately after being mounted on the substrate support 203 by heating the substrate 10. That is, the processing time of the substrate 10 is shortened, thereby improving the manufacturing throughput of the semiconductor device.

In addition, by turning on the second heating part 324 after mounting the unprocessed substrate 10 on the uppermost substrate support part 203, it is possible to suppress heating of at least one of the substrate loading port 331, the gate valve 332, an O-ring provided around the gate valve 332, and so on.

Further, although an example is here illustrated in which the first heating part 321 and the second heating part 324 are configured by different heating elements, the present disclosure is not limited to this configuration, but the first heating part 321 and the second heating part 324 may be configured by the same heating element. In other words, the upper end of the first heating part 321 may be configured to extend to the transfer chamber 330 side. The heating element used herein refers to a lamp heater, a resistance heater or the like.

Hereinafter, some aspects of the present disclosure will be additionally described as supplementary notes.

[Supplementary Note 1]

A substrate processing apparatus including: a process chamber configured to process a substrate, a transfer chamber in communication with a lower portion of the process chamber and configured to transfer the substrate to a substrate support disposed in the process chamber, and a heating chamber in communication with a lower portion of the transfer chamber and configured to heat the substrate support and the substrate, wherein a separator is installed in the substrate support.

[Supplementary Note 2]

A substrate processing apparatus including: a process chamber configured to process a substrate, a transfer chamber in communication with a lower portion of the process chamber and configured to transfer the substrate to a substrate support disposed in the process chamber, and a heating chamber in communication with a lower portion of the transfer chamber and configured to heat the substrate support and the substrate, wherein a length of the transfer chamber in a direction perpendicular to the surface of the substrate is shorter than a length of the heating chamber in the direction perpendicular to the surface of the substrate.

[Supplementary Note 3]

A substrate processing apparatus including; a process chamber configured to process a substrate, a transfer chamber in communication with a lower portion of the process chamber and configured to transfer the substrate to a substrate support disposed in the process chamber, and a heating chamber in communication with a lower portion of the transfer chamber and configured to heat the substrate support and the substrate, wherein a length of the heating chamber in a direction perpendicular to the surface of the substrate is at least a length of a substrate mounting region of the substrate support.

[Supplementary Note 4]

A substrate processing apparatus including: a process chamber configured to process a substrate; a transfer chamber in communication with a lower portion of the process chamber and configured to transfer the substrate to a substrate support disposed in the process chamber; a heating chamber in communication with a lower portion of the transfer chamber and configured to heat the substrate support and the substrate, and a controller configured to control a heating part of the heating chamber and a boat elevation mechanism so as to perform boat down and replacement between a plurality of processed substrates and a plurality of unprocessed substrates in parallel and heat the mounted unprocessed substrates sequentially in the heating chamber.

[Supplementary Note 5]

A substrate processing apparatus including: a process chamber configured to process a substrate; a transfer chamber in communication with a lower portion of the process chamber and configured to transfer the substrate to a substrate support disposed in the process chamber; a heating chamber in communication with a lower portion of the transfer chamber and configured to heat the substrate support and the substrate; and a controller configured to control a heating part of the heating chamber and a boat elevation mechanism so as to perform boat down and replacement between a plurality of processed substrates and a plurality of unprocessed substrates in parallel and heat all mounted unprocessed substrates collectively.

[Supplementary Note 6]

A substrate processing apparatus including: a process chamber configured to process a substrate, a transfer chamber in communication with a lower portion of the process chamber and configured to transfer the substrate to a substrate support disposed in the process chamber, and a heating chamber in communication with a lower portion of the transfer chamber and configured to heat the substrate support and the substrate, wherein the heating by the heating chamber is continued to perform boat down and boat loading.

[Supplementary Note 7]

A substrate processing apparatus including: a process chamber configured to process a substrate, a transfer chamber in communication with a lower portion of the process chamber and configured to transfer the substrate to a substrate support disposed in the process chamber, and a heating chamber in communication with a lower portion of the transfer chamber and configured to heat the substrate support and the substrate, wherein the heating by a heater in the process chamber side is continued to perform boat down and boat loading.

[Supplementary Note 8]

A substrate processing apparatus including: a process chamber configured to process a substrate, a transfer chamber in communication with a lower portion of the process chamber and configured to transfer the substrate to a substrate support disposed in the process chamber, and a heating chamber in communication with a lower portion of the transfer chamber and configured to heat the substrate support and the substrate, wherein the transfer chamber, the heating chamber and a reaction chamber communicate with each other to form a vacuum atmosphere.

[Supplementary Note 9]

A substrate processing apparatus including: a process chamber configured to process a substrate, a transfer chamber in communication with a lower portion of the process chamber and configured to transfer the substrate to a substrate support disposed in the process chamber, and a heating chamber in communication with a lower portion of the transfer chamber and configured to heat the substrate support and the substrate, wherein a lamp is turning on to heat the heating chamber before preheating (before unloading the boat).

[Supplementary Note 10]

A substrate processing apparatus including: a process chamber configured to process a substrate, a transfer chamber in communication with a lower portion of the process chamber and configured to transfer the substrate to a substrate support disposed in the process chamber, and a heating chamber in communication with a lower portion of the transfer chamber and configured to heat the substrate support and the substrate, wherein a SiC member is provided in the heating chamber to form a hot wall.

[Supplementary Note 11]

A substrate processing apparatus including: a process chamber configured to process a substrate, a transfer chamber in communication with a lower portion of the process chamber and configured to transfer the substrate to a substrate support disposed in the process chamber, and a heating chamber in communication with a lower portion of the transfer chamber and configured to heat the substrate support and the substrate, wherein control of a heater in a lower portion of a reaction chamber is switched at the time of boat unloading.

[Supplementary Note 12]

A substrate processing apparatus including; a process chamber configured to process a substrate, a transfer chamber in communication with a lower portion of the process chamber and configured to transfer the substrate to a substrate support disposed in the process chamber, and a heating chamber in communication with a lower portion of the transfer chamber and configured to heat the substrate support and the substrate, wherein a heater in a lower portion of a reaction chamber is controlled to fix or reduce electric power of the heater in the lower portion of the reaction chamber at the time of boat unloading.

[Supplementary Note 13]

A substrate processing apparatus including: a process chamber configured to process a substrate, a transfer chamber in communication with a lower portion of the process chamber and configured to transfer the substrate to a substrate support disposed in the process chamber, and a heating chamber in communication with a lower portion of the transfer chamber and configured to heat the substrate support and the substrate, wherein rotation of a boat is started after replacement of plurality of substrates is completed.

[Supplementary Note 14]

A substrate processing apparatus including: a process chamber configured to process a substrate, a transfer chamber in communication with a lower portion of the process chamber and configured to transfer the substrate to a substrate support disposed in the process chamber, and a heating chamber in communication with a lower portion of the transfer chamber and configured to heat the substrate support and the substrate, wherein the heating chamber is cooled to suppress a teaching deviation.

According to the present disclosure in some embodiments, it is possible to improve a throughput of substrate processing.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a process chamber configured to process a substrate mounted on a substrate support as a heated boat for supporting a plurality of substrates in a vertical direction;
   a transfer chamber in communication with a lower portion of the process chamber in the vertical direction;
   a heating chamber in communication with a lower portion of the transfer chamber in the vertical direction;
   wherein the transfer chamber is configured to transfer the processed substrate of the plurality of substrates out of the substrate support via a substrate loading port while a portion of the substrate support in which an unprocessed substrate of the plurality of substrates is held is positioned in the heating chamber, and
   wherein the heating chamber is configured such that the unprocessed substrate of the plurality of substrates supported in the portion of the substrate support is heated therein at a first temperature by the heated boat while the processed substrate is transferred out of the substrate support after being heated to a second temperature greater than the first temperature;
   wherein the transfer chamber is further configured to transfer another unprocessed substrate of the plurality of substrates onto the substrate support via the substrate loading port after the processed substrate is transferred out of the substrate support.

2. The substrate processing apparatus of claim 1, wherein a length of the transfer chamber in a direction perpendicular to a surface of the substrate is shorter than a length of the heating chamber in the direction perpendicular to the surface of the substrate.

3. The substrate processing apparatus of claim 1, wherein a length of the heating chamber in a direction perpendicular to a surface of the substrate is at least a length of a region mounting the substrate in the substrate support.

4. The substrate processing apparatus of claim 1, further comprising:
   an elevation mechanism configured to elevate the substrate support; and
   a controller configured to control the elevation mechanism so as to alternately perform lowering of the substrate support and replacement between a plurality of processed substrates and a plurality of unprocessed substrates such that mounted unprocessed substrates are collectively heated.

5. The substrate processing apparatus of claim 1, further comprising:
   an elevation mechanism configured to elevate the substrate support;
   a plurality of heaters corresponding to a plurality of zones and configured to heat the process chamber; and
   a controller configured to control the elevation mechanism and control a heater among the plurality of heaters, which corresponds to a lower zone of the plurality of zones, when the substrate support is lowered.

6. The substrate processing apparatus of claim 5, wherein the controller is configured to control the heater to fix or reduce electric power thereof, which corresponds to the lower zone of the plurality of zones, when the substrate support is lowered.

7. The substrate processing apparatus of claim 1, wherein the transfer chamber, the heating chamber, and the process chamber communicate with each other, and wherein the substrate processing apparatus further comprises an exhaust part configured to vacuum-exhaust a space of each of the transfer chamber, the heating chamber, and the process chamber.

8. The substrate processing apparatus of claim 1, further comprising a SiC member provided on a wall of the heating chamber.

9. The substrate processing apparatus of claim 1, wherein the heating chamber includes a cooling channel.

* * * * *